(12) United States Patent
Hsu et al.

(10) Patent No.: US 12,388,252 B2
(45) Date of Patent: Aug. 12, 2025

(54) DISTRIBUTED ELECTRO-STATIC DISCHARGE PROTECTION

(71) Applicant: MEDIATEK INC., Hsin-Chu (TW)

(72) Inventors: Hsin-Cheng Hsu, Hsinchu (TW); Chien-Ming Hsu, Hsinchu (TW); Jui-Ming Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 210 days.

(21) Appl. No.: 18/123,344

(22) Filed: Mar. 20, 2023

(65) Prior Publication Data
US 2023/0327428 A1    Oct. 12, 2023

Related U.S. Application Data

(60) Provisional application No. 63/329,945, filed on Apr. 12, 2022.

(51) Int. Cl.
*H02H 9/00* (2006.01)
*H02H 9/04* (2006.01)

(52) U.S. Cl.
CPC .............. *H02H 9/005* (2013.01); *H02H 9/00* (2013.01); *H02H 9/046* (2013.01)

(58) Field of Classification Search
CPC ............ H02H 9/00; H02H 9/04; H02H 9/005; H02H 9/044; H02H 9/041; H02H 9/0476; H01L 21/76895; H01L 21/768; H01L 23/535; H01L 27/0207; H01L 27/0296
USPC .......................................... 361/56, 91.1, 111
See application file for complete search history.

(56) References Cited

U.S. PATENT DOCUMENTS

| | | | |
|---|---|---|---|
| 4,825,107 A * | 4/1989 | Naganuma | H01L 27/11898 257/E27.11 |
| 7,593,202 B2 | 9/2009 | Khazhinsky et al. | |
| 8,013,362 B2 * | 9/2011 | Matsuoka | H01L 23/5286 257/691 |
| 9,064,938 B2 * | 6/2015 | Etherton | H01L 21/76895 |
| 9,076,656 B2 | 7/2015 | Etherton | |
| 2004/0188763 A1 * | 9/2004 | Taniguchi | H01L 27/0251 257/E23.153 |
| 2008/0062596 A1 | 3/2008 | Miller | |
| 2015/0155707 A1 * | 6/2015 | Truong | H02H 9/046 361/56 |
| 2015/0349522 A1 | 12/2015 | Miller | |
| 2016/0086935 A1 | 3/2016 | Fukuda | |
| 2021/0384723 A1 * | 12/2021 | Bandaru | H01L 27/0292 |
| 2022/0209527 A1 * | 6/2022 | de Raad | H02H 9/04 |

FOREIGN PATENT DOCUMENTS

| | | |
|---|---|---|
| CN | 101523683 B | 11/2012 |
| CN | 104134978 B | 11/2018 |
| JP | 2013-21249 A | 1/2013 |
| TW | I425732 | 2/2014 |
| TW | 202137477 A | 10/2021 |

* cited by examiner

*Primary Examiner* — Danny Nguyen
(74) *Attorney, Agent, or Firm* — Winston Hsu

(57) ABSTRACT

The present invention provides an integrated circuit layout including a first bank and a second bank. The first bank includes a plurality of I/O circuits and at least one first ESD clamp device. The second bank includes at least one second ESD clamp device, wherein the at least one second ESD clamp device is different in type from the at least one first ESD clamp device.

8 Claims, 12 Drawing Sheets

DISTRIBUTED ELECTRO-STATIC DISCHARGE PROTECTION

CROSS REFERENCE TO RELATED APPLICATIONS

This application claims the benefit of U.S. Provisional Application No. 63/329,945, filed on Apr. 12, 2022. The content of the application is incorporated herein by reference.

BACKGROUND

In conventional integrated circuit layout having electro-static discharge (ESD) clamp devices, the ESD clamp devices and input/output (I/O) devices are served as a single bank and placed in a same row. However, this design is inflexible and may not be optimal for circuits of different designs.

SUMMARY

It is therefore an objective of the present invention to provide an integrated circuit layout in which the ESD clamp devices are divided into more banks with different configurations, to solve the above-mentioned problems.

According to one embodiment of the present invention, an integrated circuit layout comprising a first bank and a second bank is disclosed. The first bank comprises a plurality of I/O circuits and at least one first ESD clamp device. The second bank comprises at least one second ESD clamp device, wherein the at least one second ESD clamp device is different in type from the at least one first ESD clamp device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
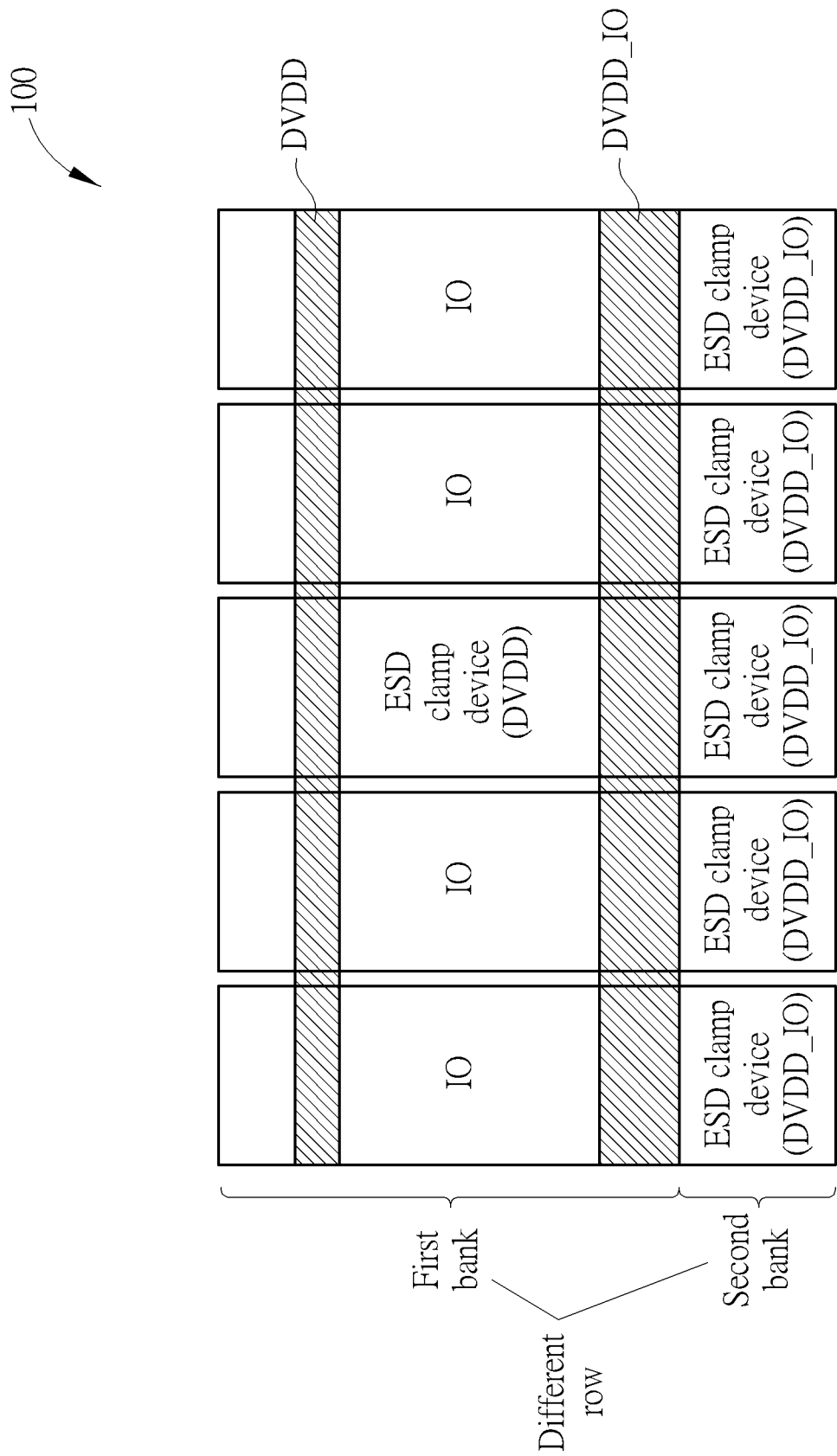
FIG. 1 is a diagram illustrating an integrated circuit layout according to a first embodiment of the present invention.

FIG. 1 is a diagram illustrating an integrated circuit layout 100 according to a first embodiment of the present invention. As shown in FIG. 1, the integrated circuit layout 100 has a rectangular-shaped design, and the integrated circuit layout 100 comprises a first bank and a second bank, wherein the first bank is arranged in an upper row, and the second bank is arranged in a lower row. In this embodiment, the first bank comprises two power lines, which are used to provide two supply voltages DVDD and DVDD_IO for the circuits within the integrated circuit layout 100. In addition, the first bank comprises a plurality of I/O devices and at least one ESD clamp device, and the second bank comprises a plurality of ESD clamp devices, wherein the ESD clamp device in the first bank has a core device supplied by the supply voltage DVDD, and each of the ESD clamp devices in the second bank is an I/O device supplied by the supply voltage DVDD_IO. Regarding the I/O device and the core device, the I/O device has a higher operating voltage, that is, can be operated by a higher supply voltage (i.e. the high-voltage device). On the other hand, the core device has a lower operating voltage, that is, can be operated by a lower supply voltage (i.e. the low-voltage device). Please note that those skilled in this art will readily understand that the distinction between the core device and the I/O device can be defined by a threshold voltage (Vth) of the transistor, a gate oxide thickness of the transistor, a junction breakdown voltage of the transistor, a well doping density of the transistor, a static leakage current of the transistor, or other suitable characteristics known in the semiconductor field.

Figure 2:
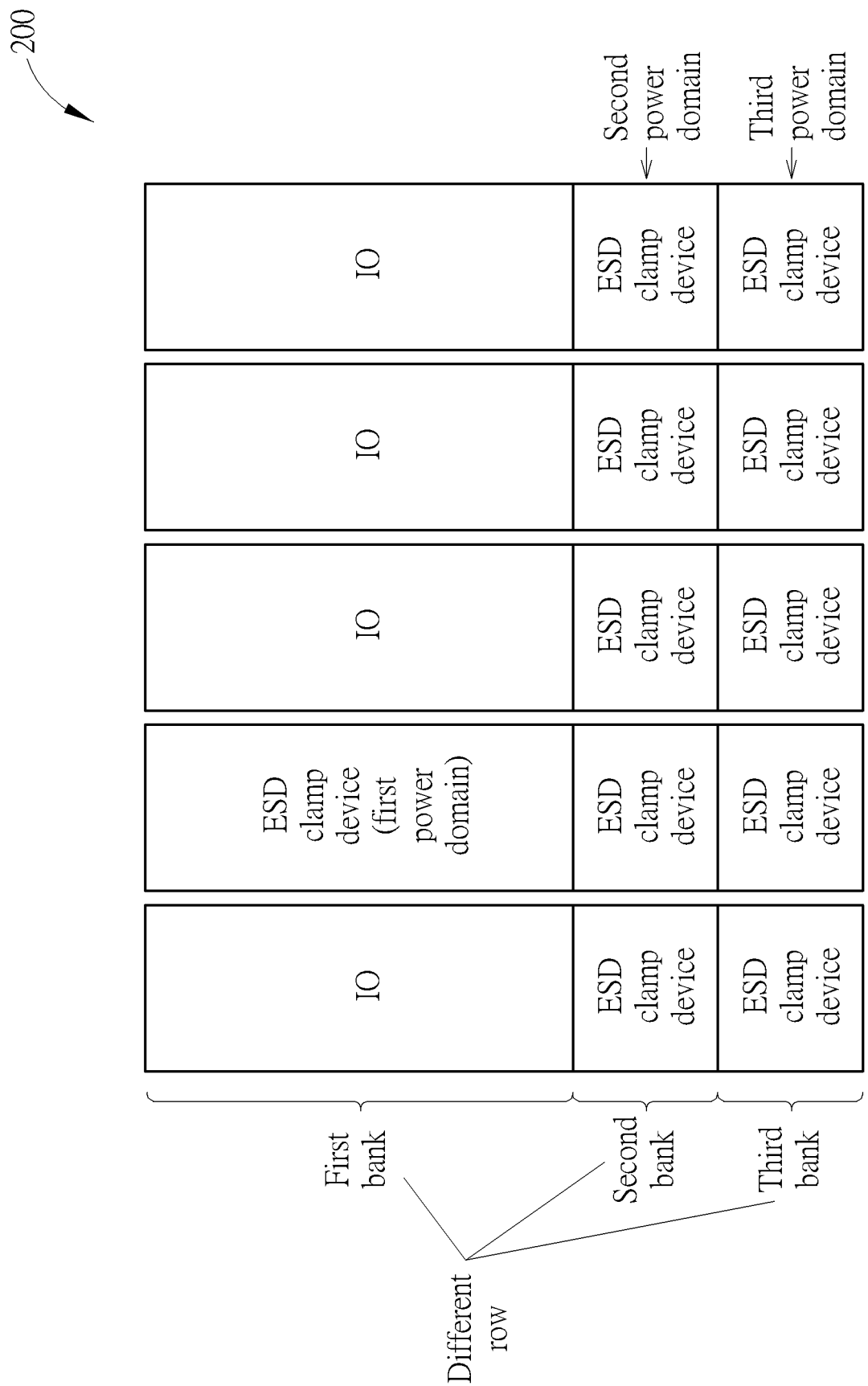
FIG. 2 is a diagram illustrating an integrated circuit layout according to a second embodiment of the present invention.

FIG. 2 is a diagram illustrating an integrated circuit layout 200 according to a second embodiment of the present invention. As shown in FIG. 2, the integrated circuit layout 200 has a rectangular-shaped design, and the integrated circuit layout 200 comprises a first bank, a second bank and a third bank, wherein the first bank is arranged in an upper row, the second bank is arranged in a middle row, and the third bank is arranged in a lower row. In this embodiment, the first bank comprises a plurality of I/O devices and at least one ESD clamp device, the second bank comprises a plurality of ESD clamp devices, and third bank comprises a plurality of ESD clamp devices, wherein the ESD clamp device in the first bank is powered by a first supply voltage belonging to a first power domain, each ESD clamp device in the second bank is powered by a second supply voltage belonging to a second power domain, and each ESD clamp device in the third bank is powered by a third supply voltage belonging to a third power domain.

Figure 3:
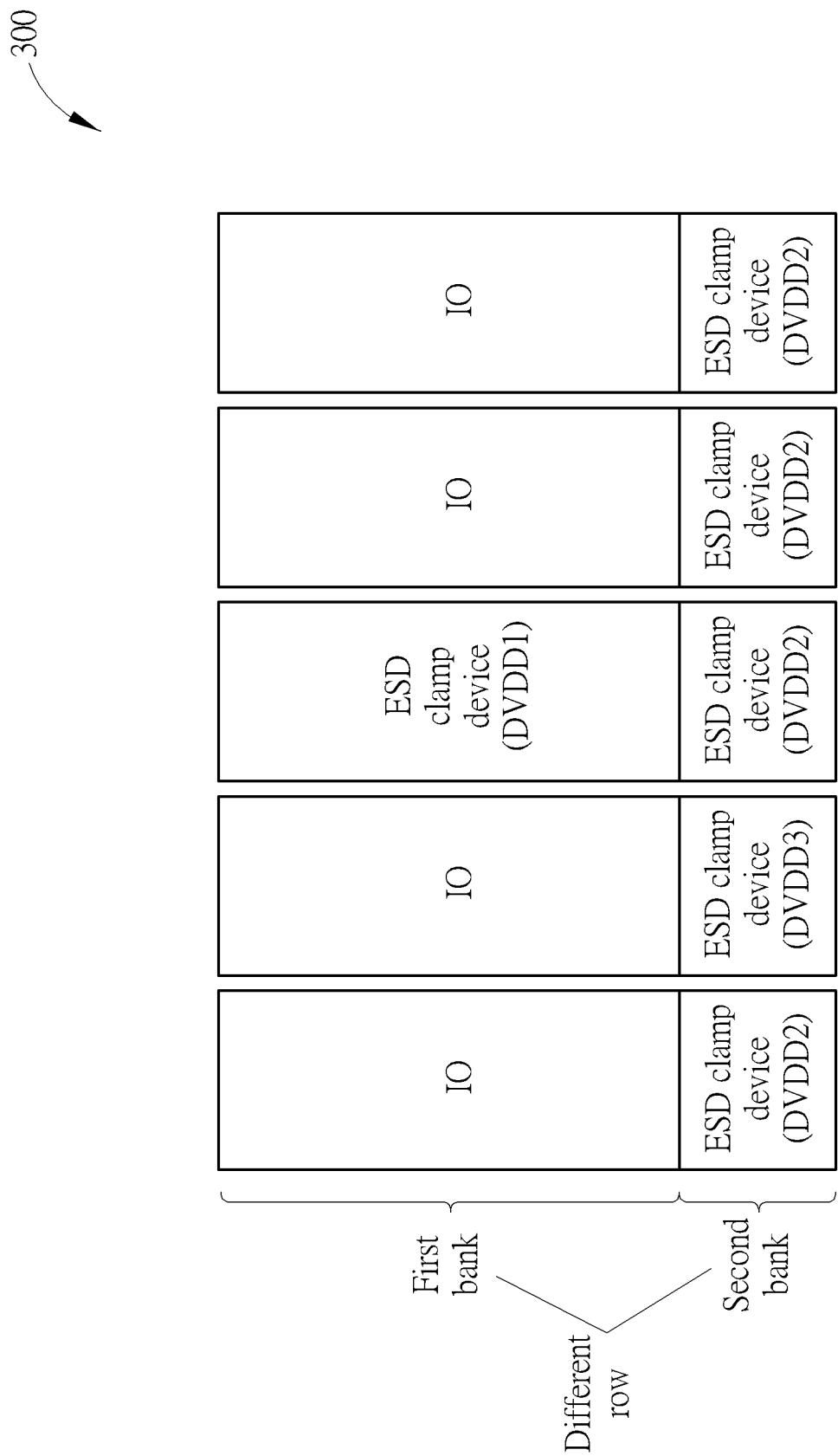
FIG. 3 is a diagram illustrating an integrated circuit layout according to a third embodiment of the present invention.

FIG. 3 is a diagram illustrating an integrated circuit layout 300 according to a third embodiment of the present invention. As shown in FIG. 3, the integrated circuit layout 300 has a rectangular-shaped design, and the integrated circuit layout 300 comprises a first bank and a second bank, wherein the first bank is arranged in an upper row, and the second bank is arranged in a lower row. In this embodiment, the first bank comprises a plurality of I/O devices and at least one ESD clamp device, and the second bank comprises a plurality of ESD clamp devices, wherein the ESD clamp device in the first bank is powered by a first supply voltage DVDD1 belonging to a first power domain, part of the ESD clamp devices in the second bank is/are powered by a second supply voltage DVDD2 belonging to a second power domain, and another part of the ESD clamp devices in the second bank is/are powered by a third supply voltage DVDD3 belonging to a third power domain.

Figure 4:
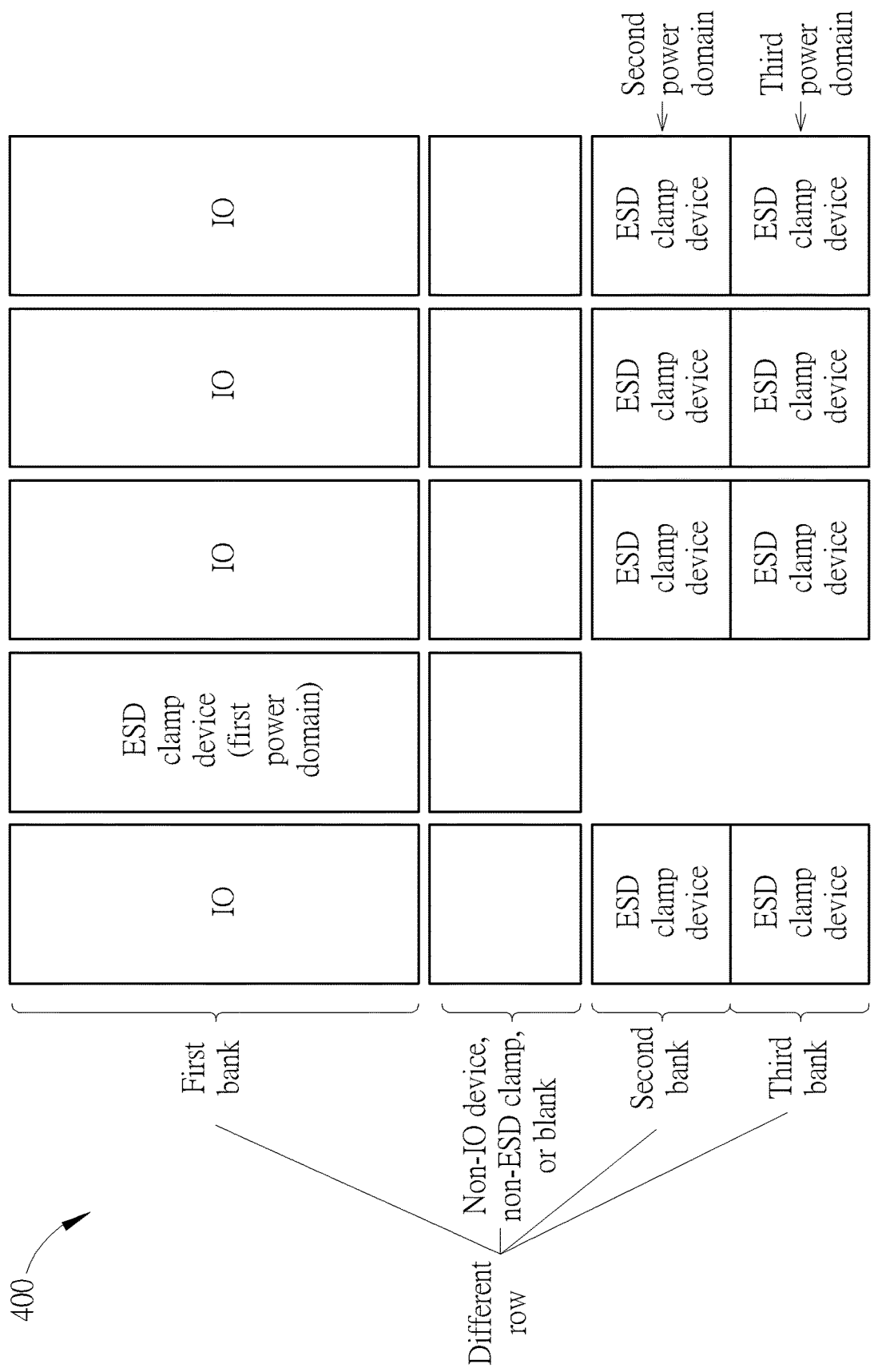
FIG. 4 is a diagram illustrating an integrated circuit layout according to a fourth embodiment of the present invention.

FIG. 4 is a diagram illustrating an integrated circuit layout 400 according to a fourth embodiment of the present invention. As shown in FIG. 4, the integrated circuit layout 400 has a rectangular-shaped design, and the integrated circuit layout 400 comprises a first bank, a second bank and a third bank, wherein the first bank is arranged in a first row, the second bank is arranged in a third row, and the third bank is arranged in a fourth row, wherein the second row is used to place the non-I/O device, non-ESD clamp device, or leave blank. In this embodiment, the first bank comprises a plurality of I/O devices and at least one ESD clamp device, the second bank comprises a plurality of ESD clamp devices, and third bank comprises a plurality of ESD clamp devices, wherein the ESD clamp device in the first bank is powered by a first supply voltage belonging to a first power domain, each ESD clamp device in the second bank is powered by a second supply voltage belonging to a second power domain, and each ESD clamp device in the third bank is powered by a third supply voltage belonging to a third power domain.

Figure 5:
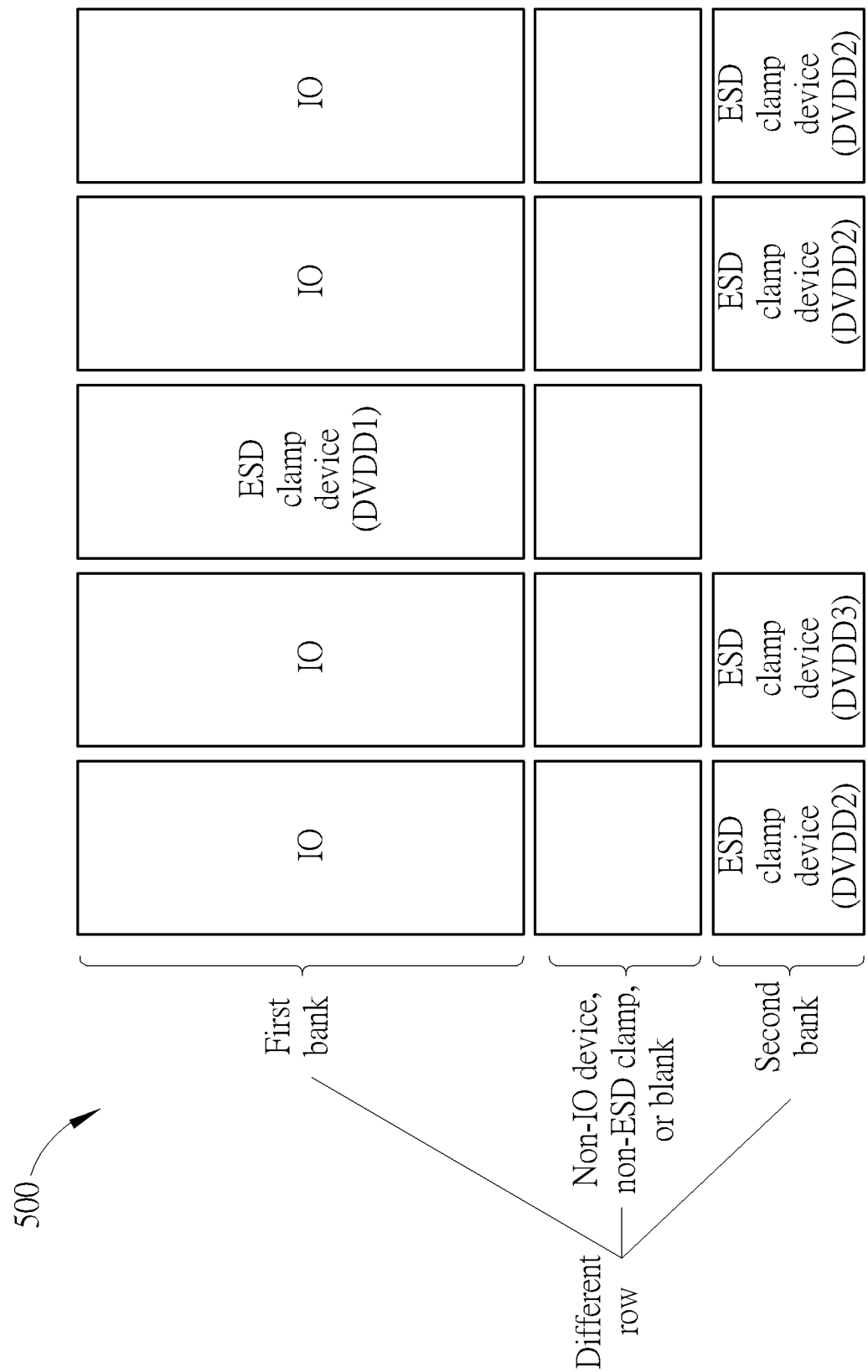
FIG. 5 is a diagram illustrating an integrated circuit layout according to a fifth embodiment of the present invention.

FIG. 5 is a diagram illustrating an integrated circuit layout 500 according to a fifth embodiment of the present invention. As shown in FIG. 5, the integrated circuit layout 500 has a rectangular-shaped design, and the integrated circuit layout 500 comprises a first bank and a second bank, wherein the first bank is arranged in an upper row, and the second bank is arranged in a lower row, wherein the middle row is used to place the non-I/O device, non-ESD clamp device, or leave blank. In this embodiment, the first bank comprises a plurality of I/O devices and at least one ESD clamp device, and the second bank comprises a plurality of ESD clamp devices, wherein the ESD clamp device in the first bank is powered by a first supply voltage DVDD1 belonging to a first power domain, part of the ESD clamp devices in the second bank is/are powered by a second supply voltage DVDD2 belonging to a second power domain, and another part of the ESD clamp devices in the second bank is/are powered by a third supply voltage DVDD3 belonging to a third power domain.

In the embodiments shown in FIG. 1-FIG. 5, by arranging the ESD clamp devices in different rows, the ESD clamp device layout will be more flexible for different circuit designs.

Figure 6:
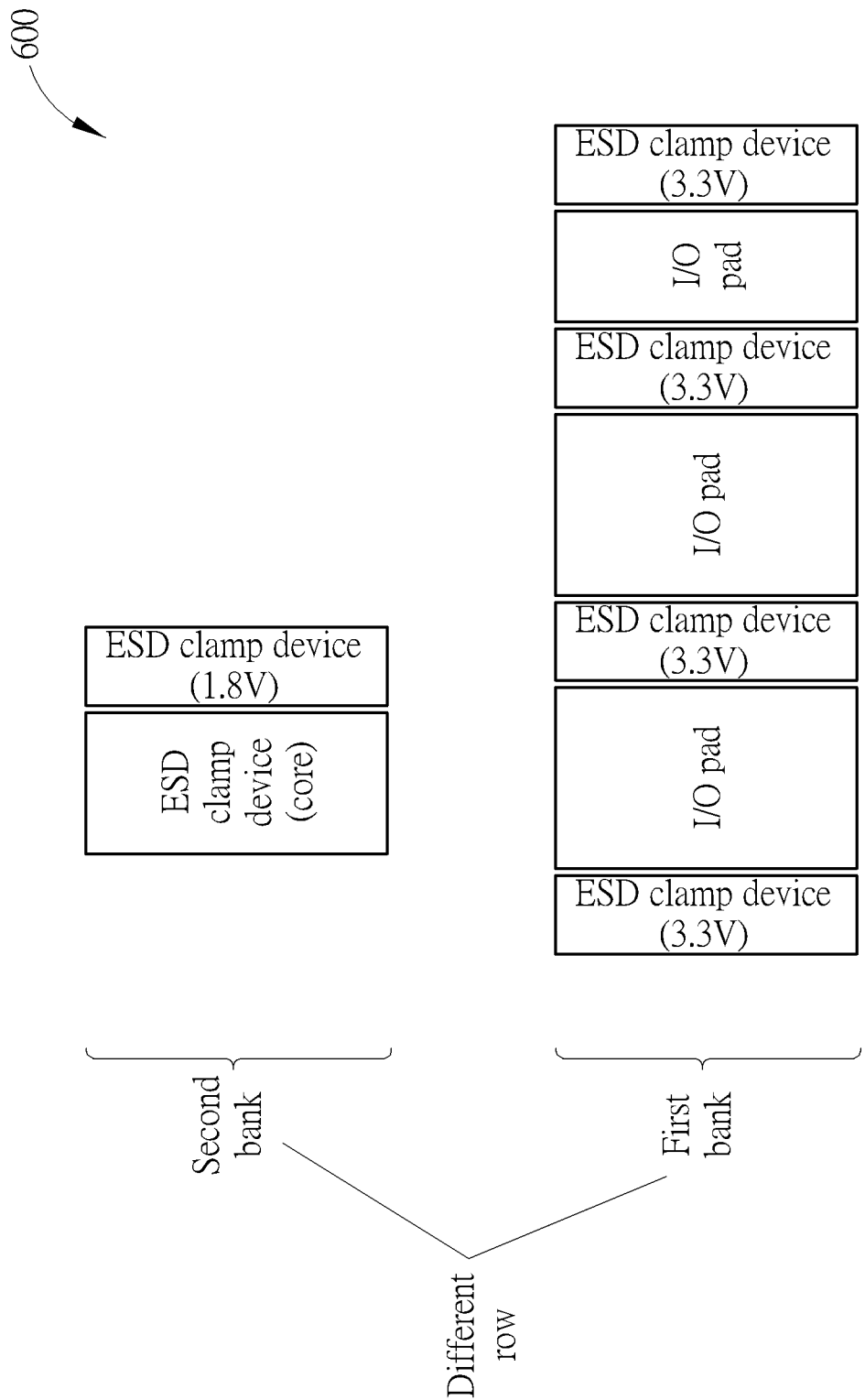
FIG. 6 is a diagram illustrating an integrated circuit layout according to a sixth embodiment of the present invention.

FIG. 6 is a diagram illustrating an integrated circuit layout 600 according to a sixth embodiment of the present invention. As shown in FIG. 6, the integrated circuit layout 600 comprises a first bank and a second bank, wherein the first bank is arranged in a lower row, and the second bank is arranged in an upper row. In this embodiment, the first bank comprises a plurality of ESD clamp devices and a plurality of I/O pads, wherein the left and right sides of each I/O pad are immediately connected to the ESD clamp devices implemented by using I/O devices with high supply voltage such as 3.3V; and the second bank comprises two adjacent ESD clamp devices, wherein one of the ESD clamp devices is implemented by using core device(s) with lower supply voltage, and the other one of the ESD clamp devices is implemented by using I/O device(s) with the supply voltage such as 1.8V.

Figure 7:
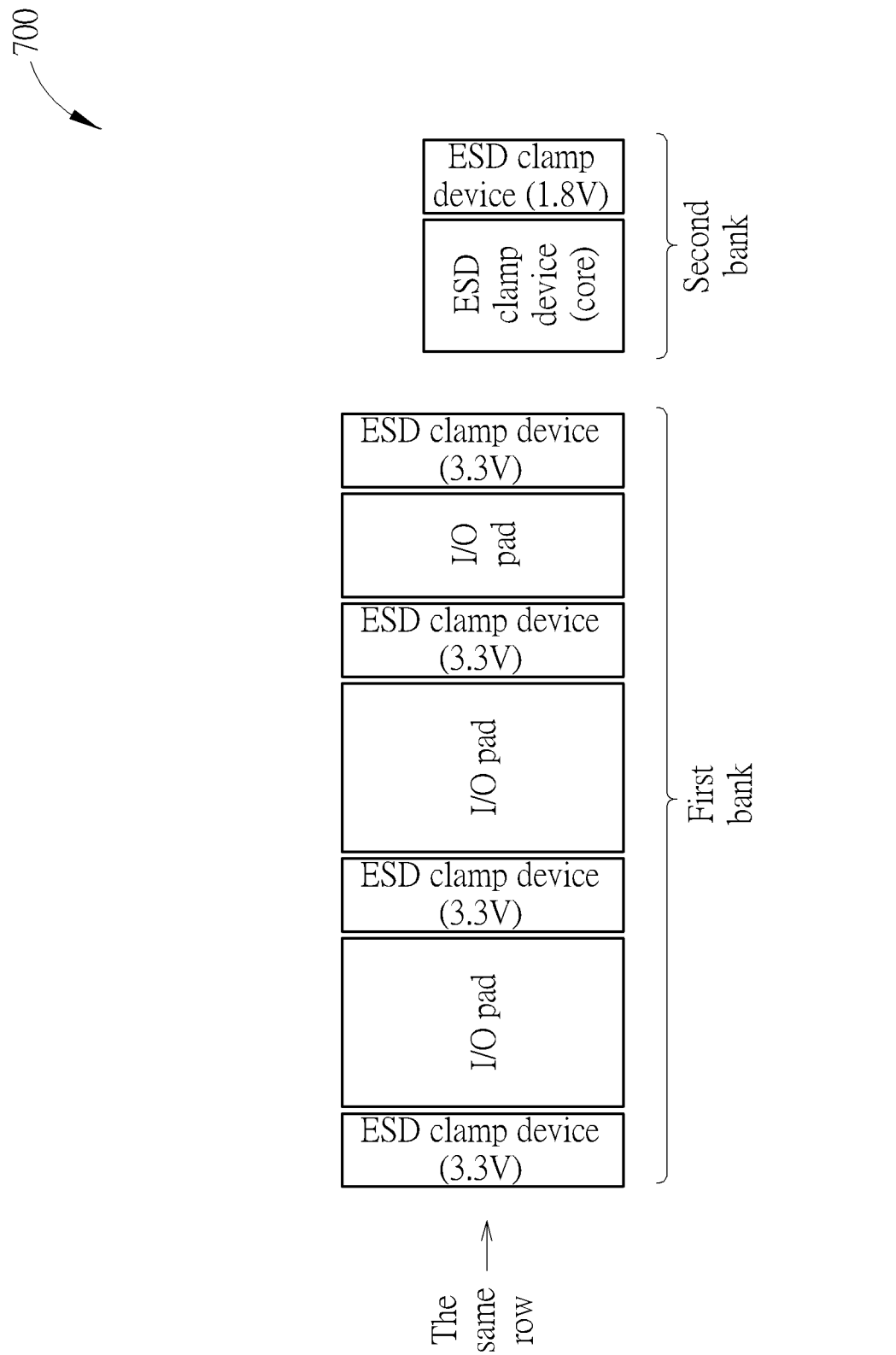
FIG. 7 is a diagram illustrating an integrated circuit layout according to a seventh embodiment of the present invention.

FIG. 7 is a diagram illustrating an integrated circuit layout 700 according to a seventh embodiment of the present invention. As shown in FIG. 7, the integrated circuit layout 700 has a rectangular-shaped design, and the integrated circuit layout 700 comprises a first bank and a second bank, wherein the first bank and the second bank are arranged in the same row. In this embodiment, the first bank comprises a plurality of ESD clamp devices and a plurality of I/O pads, wherein the left and right sides of each I/O pad are immediately connected to the ESD clamp devices implemented by using I/O devices with high supply voltage such as 3.3V; and the second bank comprises two adjacent ESD clamp devices, wherein one of the ESD clamp devices is implemented by using core device(s) with lower supply voltage, and the other one of the ESD clamp devices is implemented by using I/O device(s) with the supply voltage such as 1.8V. In addition, the ESD clamp devices of the first bank and the ESD clamp devices of the second bank are from different I/O library, that is the ESD clamp devices have different schematics.

Figure 8:
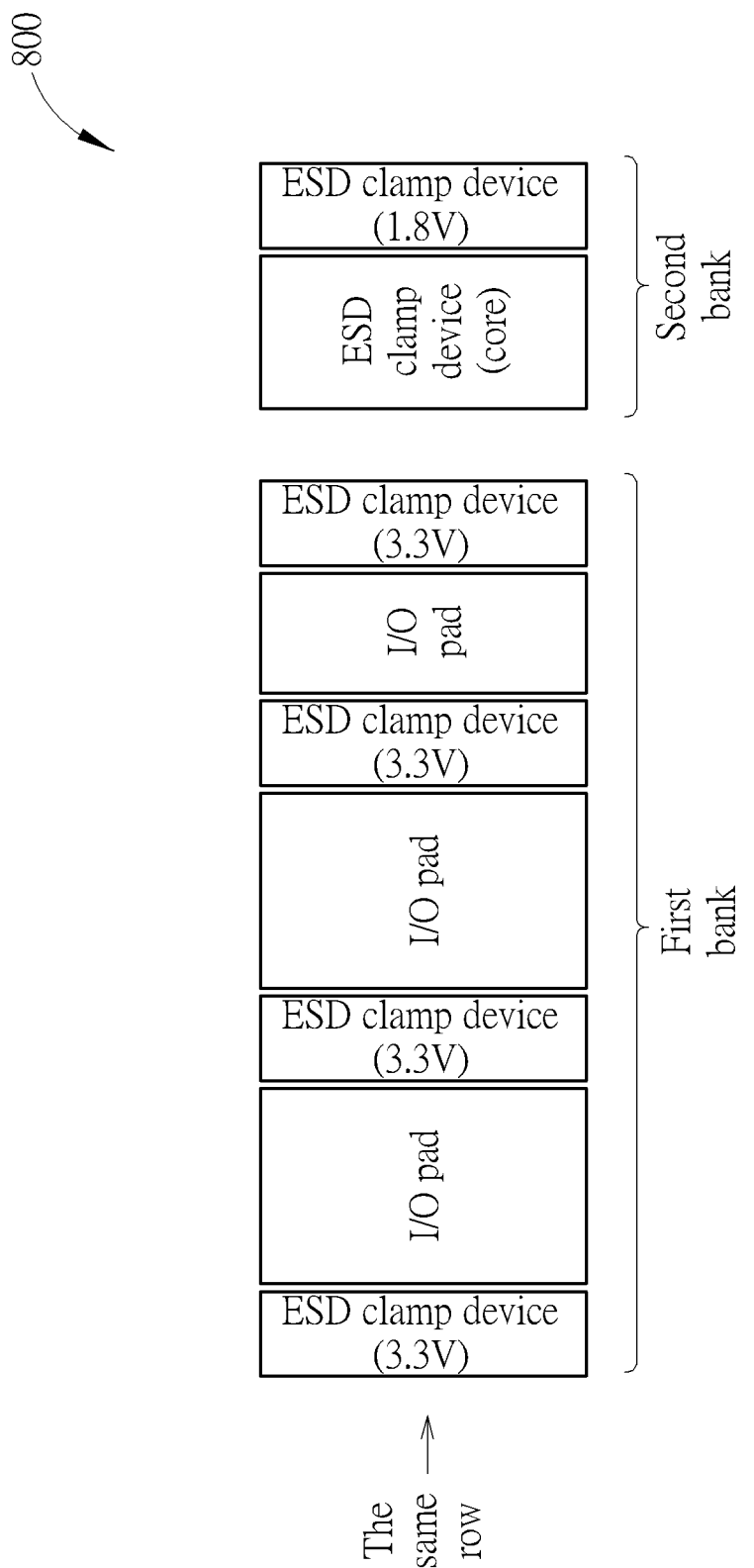
FIG. 8 is a diagram illustrating an integrated circuit layout according to an eighth embodiment of the present invention.

FIG. 8 is a diagram illustrating an integrated circuit layout 800 according to an eighth embodiment of the present invention. As shown in FIG. 8, the integrated circuit layout 800 has a rectangular-shaped design, and the integrated circuit layout 800 comprises a first bank and a second bank, wherein the first bank and the second bank are arranged in the same row. In this embodiment, the first bank comprises a plurality of ESD clamp devices and a plurality of I/O pads, wherein the left and right sides of each I/O pad are immediately connected to the ESD clamp devices implemented by using I/O devices with high supply voltage such as 3.3V; and the second bank comprises two adjacent ESD clamp devices, wherein one of the ESD clamp devices is implemented by using core device(s) with lower supply voltage, and the other one of the ESD clamp devices is implemented by using I/O device(s) with the supply voltage such as 1.8V. In addition, the ESD clamp devices of the first bank and the ESD clamp devices of the second bank are from the same I/O library.

In the embodiments shown in FIG. 6-FIG. 8, by dividing the ESD clamp devices with different types to different banks, the ESD clamp device layout will be more flexible for different circuit designs.

Figure 9:
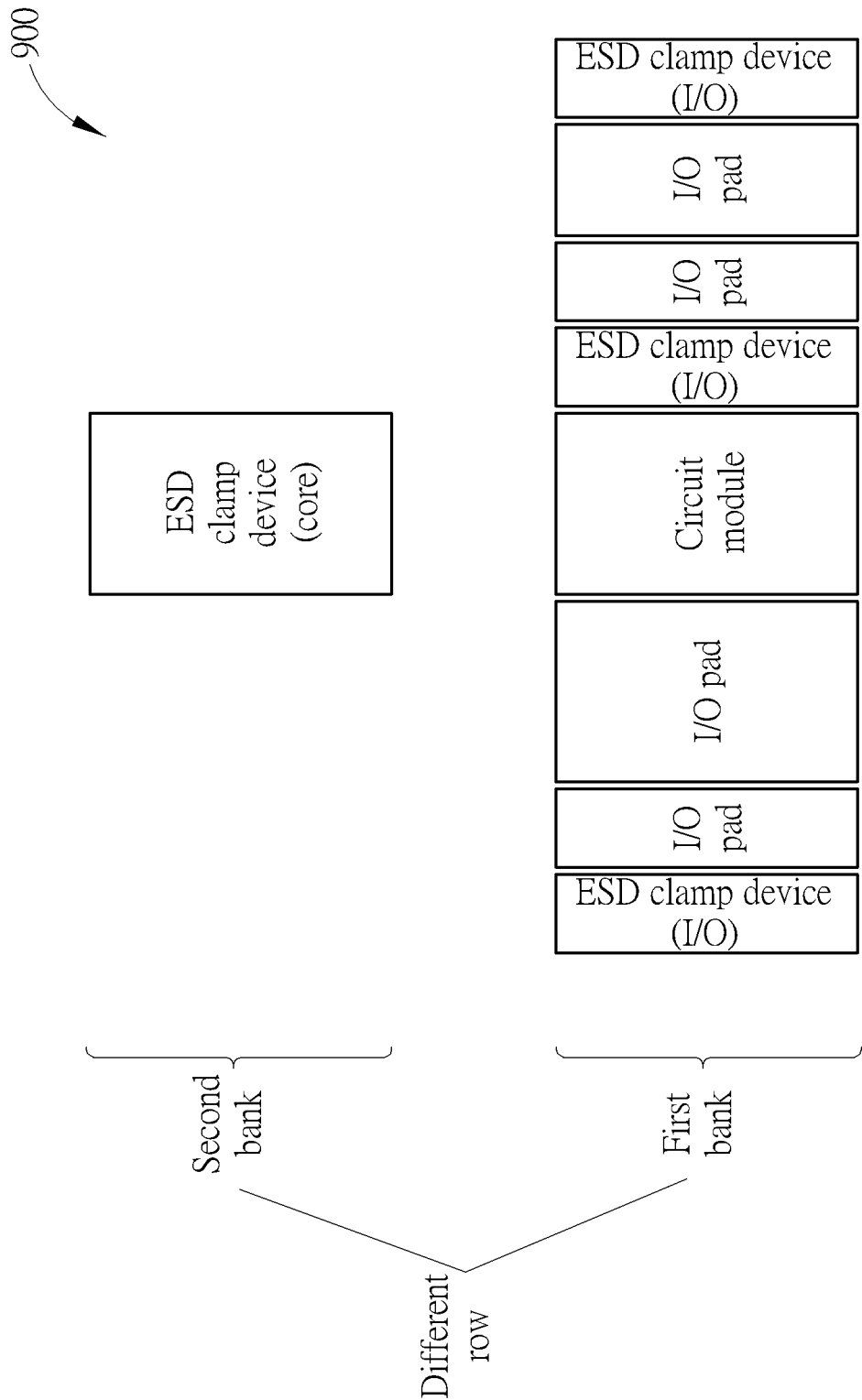
FIG. 9 is a diagram illustrating an integrated circuit layout according to a ninth embodiment of the present invention.

FIG. 9 is a diagram illustrating an integrated circuit layout 900 according to a ninth embodiment of the present invention. As shown in FIG. 9, the integrated circuit layout 900 comprises a first bank and a second bank, wherein the first bank is arranged in a lower row, and the second bank is arranged in an upper row. In this embodiment, the first bank comprises a plurality of ESD clamp devices, at least one circuit module and a plurality of I/O pads, wherein part of the I/O pads are immediately connected to the ESD clamp devices implemented by using I/O devices; and the second bank comprises an ESD clamp device implemented by using core device(s).

Figure 10:
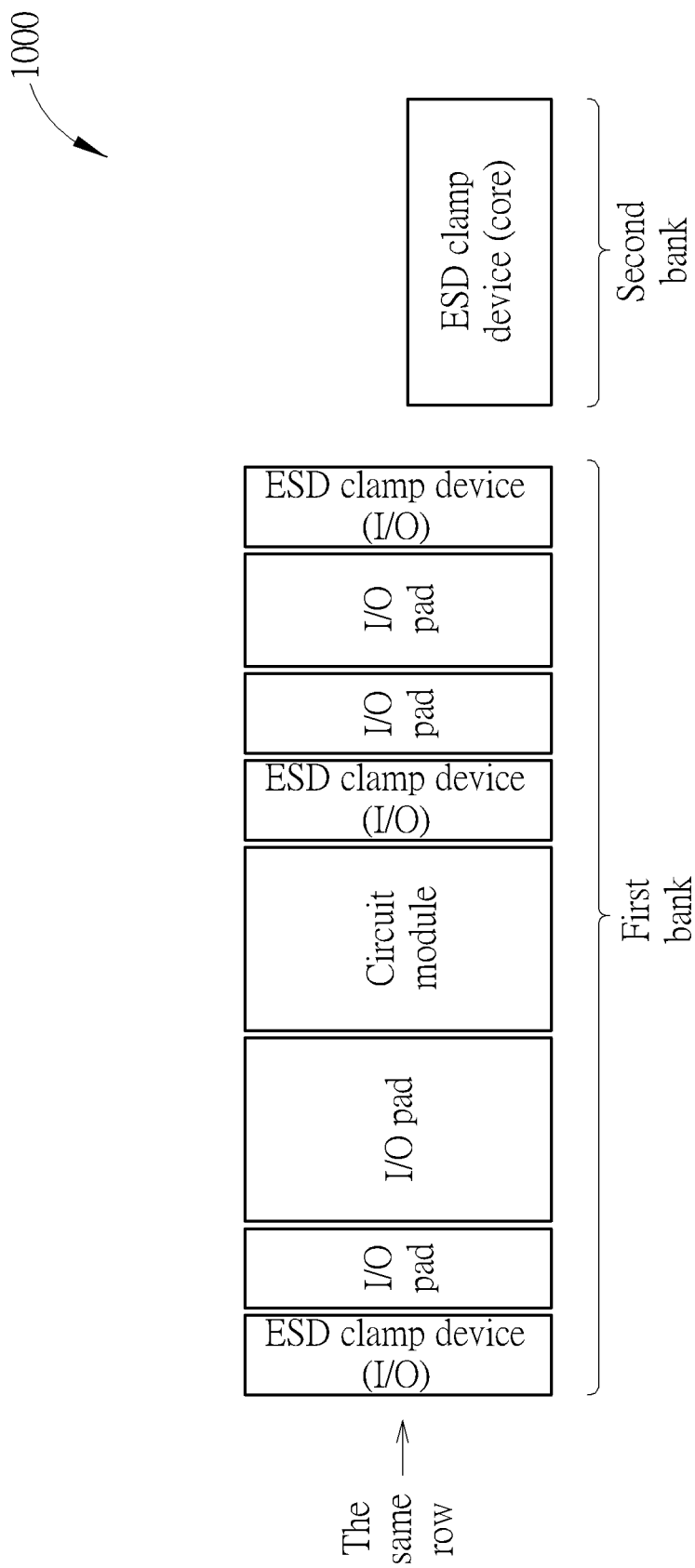
FIG. 10 is a diagram illustrating an integrated circuit layout according to a tenth embodiment of the present invention.

FIG. 10 is a diagram illustrating an integrated circuit layout 1000 according to a tenth embodiment of the present invention. As shown in FIG. 10, the integrated circuit layout 1000 has a rectangular-shaped design, and the integrated circuit layout 1000 comprises a first bank and a second bank, wherein the first bank and the second bank are arranged in the same row. In this embodiment, the first bank comprises a plurality of ESD clamp devices, at least one circuit module and a plurality of I/O pads, wherein part of the I/O pads are immediately connected to the ESD clamp devices implemented by using I/O devices; and the second bank comprises the ESD clamp devices implemented by using core device(s). In addition, the ESD clamp devices of the first bank and the ESD clamp devices of the second bank are from different I/O library, that is the ESD clamp devices have different schematics.

Figure 11:
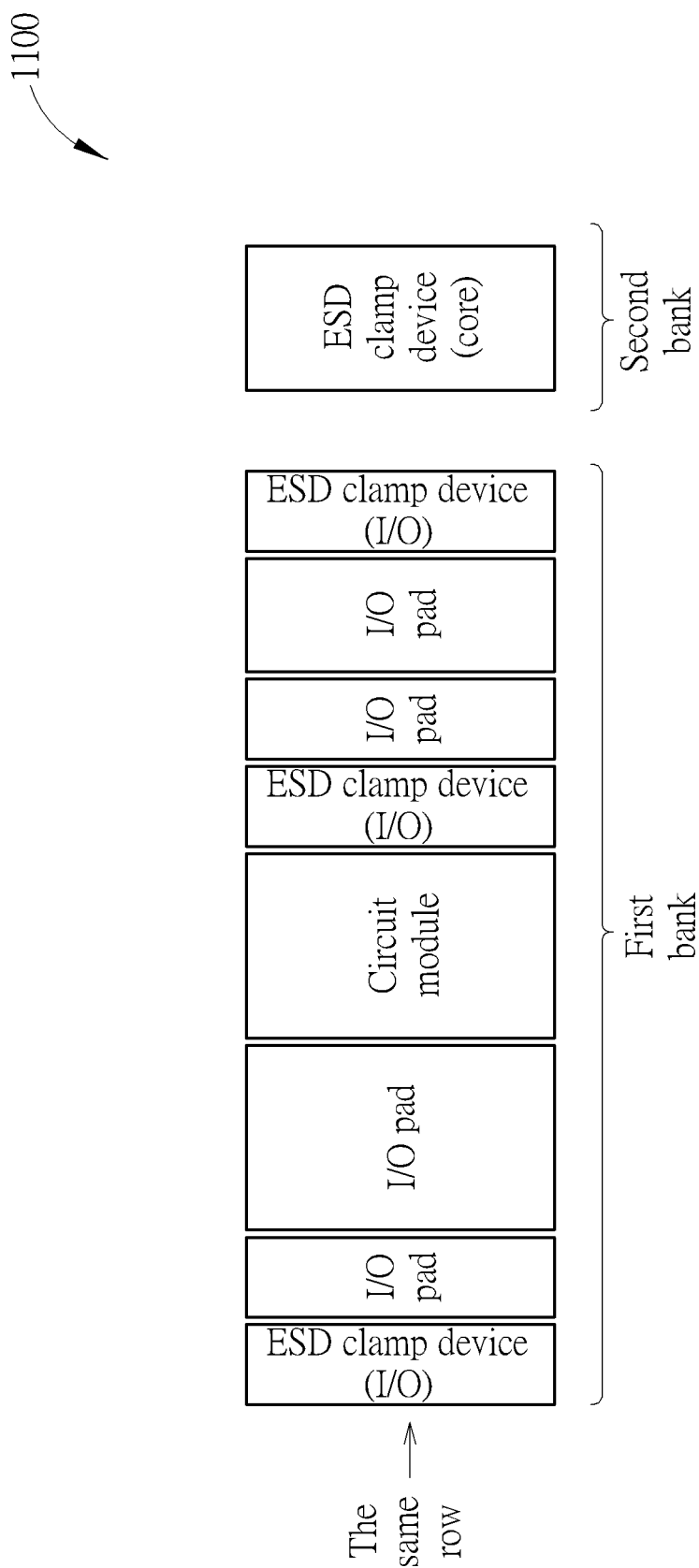
FIG. 11 is a diagram illustrating an integrated circuit layout according to an eleventh embodiment of the present invention.

FIG. 11 is a diagram illustrating an integrated circuit layout 1100 according to an eleventh embodiment of the present invention. As shown in FIG. 11, the integrated circuit layout 1100 has a rectangular-shaped design, and the integrated circuit layout 1100 comprises a first bank and a second bank, wherein the first bank and the second bank are arranged in the same row. In this embodiment, the first bank comprises a plurality of ESD clamp devices, at least one circuit module and a plurality of I/O pads, wherein part of the I/O pads are immediately connected to the ESD clamp devices implemented by using I/O devices; and the second bank comprises the ESD clamp devices implemented by using core device(s). In addition, the ESD clamp devices of the first bank and the ESD clamp devices of the second bank are from the same I/O library.

Figure 12:
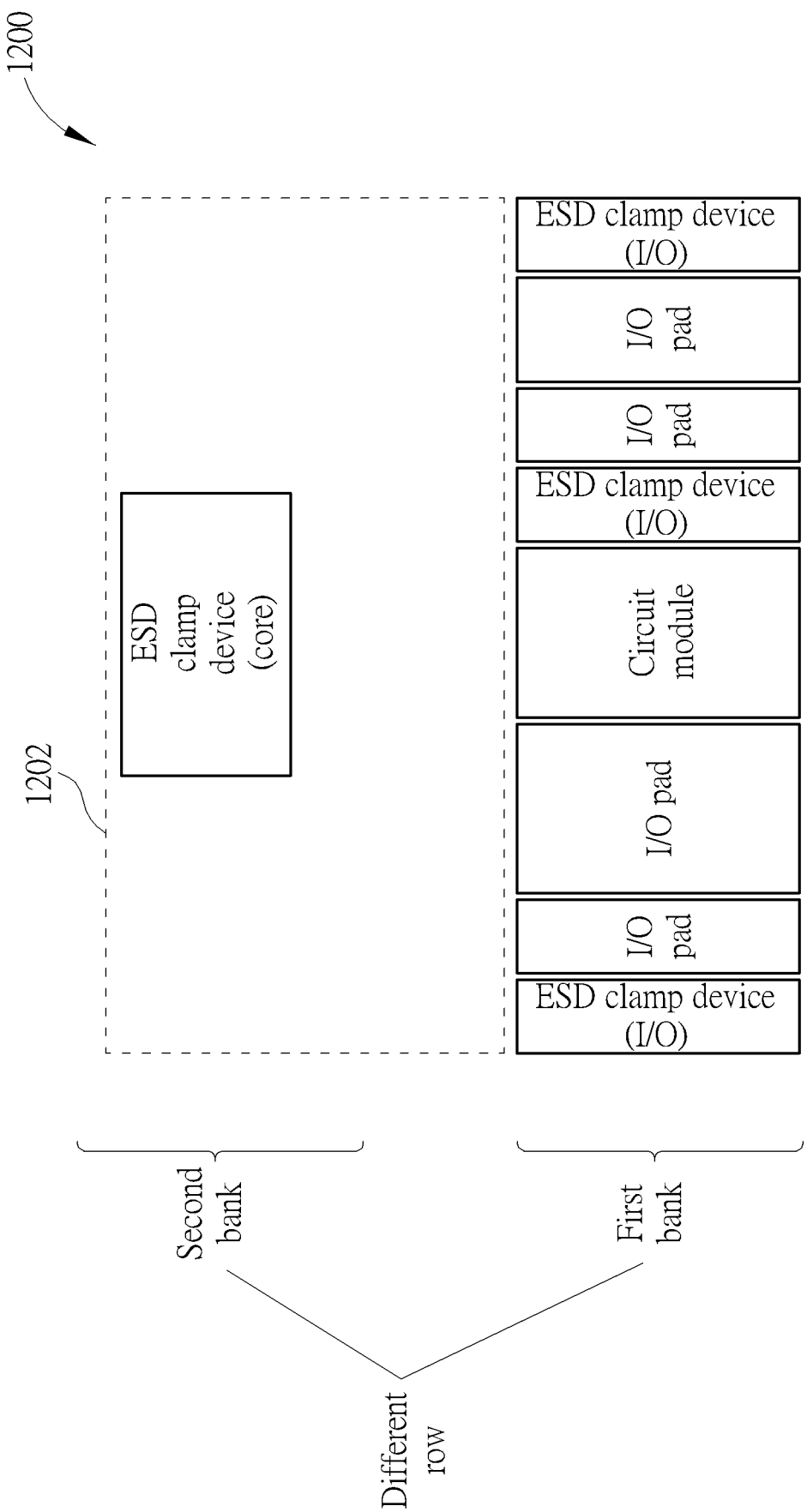
FIG. 12 is a diagram illustrating an integrated circuit layout according to a twelfth embodiment of the present invention.

FIG. 12 is a diagram illustrating an integrated circuit layout 1200 according to a twelfth embodiment of the present invention. As shown in FIG. 12, the integrated circuit layout 1200 has a rectangular-shaped design, and the integrated circuit layout 1200 comprises a first bank and a second bank, wherein the first bank is arranged in a lower row, and the second bank is arranged in an upper row. In this embodiment, the first bank comprises a plurality of ESD clamp devices, at least one circuit module and a plurality of I/O pads, wherein part of the I/O pads are immediately connected to the ESD clamp devices implemented by using I/O devices; and the second bank comprises an ESD clamp device implemented by using core device(s). In addition, the ESD clamp devices of the first bank and the ESD clamp devices of the second bank are from different I/O library, that is, the ESD clamp devices have different schematics. Furthermore, the area between the ESD clamp device of the second bank and a dashed box 1202 can be blank or have other devices such as analog circuits or memory (i.e. non-I/O device, non-ESD clamp device).

In the embodiments shown in FIG. 9-FIG. 12, by dividing the ESD clamp devices with different types to different banks, the ESD clamp device layout will be more flexible for different circuit designs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit layout, comprising:
a first bank, comprising a plurality of input/output (I/O) circuits and at least one first electro-static discharge (ESD) clamp device; and
a second bank, comprising at least one second ESD clamp device, wherein the at least one second ESD clamp device is different in type from the at least one first ESD clamp device;
a third bank, comprising at least one third ESD clamp device, wherein the third is arranged in a third row of the integrated circuit layout;
wherein the first bank is arranged in a first row of the integrated circuit layout, the second bank is arranged in a second row of the integrated circuit layout;
wherein the at least one first ESD clamp device is powered by a first supply voltage belonging to a first power domain, the at least one second ESD clamp device is powered by a second supply voltage belonging to a second power domain, and the at least one third ESD clamp device is powered by a third supply voltage belonging to a third power domain;
wherein the third row is adjacent to the second row of the integrated circuit layout, and there is a row comprising non-I/O devices or non-ESD clamp cells between the first row and the second row of the integrated circuit layout.

2. The integrated circuit layout of claim 1, wherein the at least one first ESD clamp devices are implemented by using core device(s), and the at least one second ESD clamp device is implemented by using I/O device(s).

3. An integrated circuit layout, comprising:
a first bank, comprising a plurality of input/output (I/O) circuits and at least one first electro-static discharge (ESD) clamp device; and
a second bank, comprising at least one second ESD clamp device, wherein the at least one second ESD clamp device is different in type from the at least one first ESD clamp device;
wherein the first bank is arranged in a first row of the integrated circuit layout, the second bank is arranged in a second row of the integrated circuit layout;
wherein the second bank comprises the at least one second ESD clamp device and at least one third ESD clamp device, and the at least one third ESD clamp device is different in type from the at least one second ESD clamp device;
wherein there is a row comprising non-I/O devices or non-ESD clamp cells between the first row and the second row of the integrated circuit layout.

4. An integrated circuit layout, comprising:
a first bank, comprising a plurality of input/output (I/O) circuits and at least one first electro-static discharge (ESD) clamp device; and
a second bank, comprising at least one second ESD clamp device, wherein the at least one second ESD clamp device is different in type from the at least one first ESD clamp device;
wherein the second bank comprises the at least one second ESD clamp device and at least one third ESD clamp device, the at least one first ESD clamp device is implemented by using first I/O device(s), the at least one second ESD clamp device is implemented by using second I/O device(s), and the at least one third ESD clamp device is implemented by using core device(s);
wherein the first bank comprises the plurality of I/O circuits and a plurality of first ESD clamp devices, and left and right sides of each I/O pad are immediately connected to the first ESD clamp devices implemented.

5. The integrated circuit layout of claim 4, wherein the second I/O device(s) and the first I/O device(s) are from different I/O libraries.

6. The integrated circuit layout of claim 1, wherein the at least one first ESD clamp device is implemented by using first I/O device(s), and the at least one second ESD clamp device is implemented by using core device(s).

7. The integrated circuit layout of claim 6, wherein the second I/O device(s) and the first I/O device(s) are from different I/O libraries.

8. An integrated circuit layout, comprising:
- a first bank, comprising a plurality of input/output (I/O) circuits and at least one first electro-static discharge (ESD) clamp device; and
- a second bank, comprising at least one second ESD clamp device, wherein the at least one second ESD clamp device is different in type from the at least one first ESD clamp device;
- wherein the at least one first ESD clamp device is implemented by using first I/O device(s), and the at least one second ESD clamp device is implemented by using core device(s);
- wherein there is a row comprising non-I/O devices or non-ESD clamp cells between the first bank and the second bank.

* * * * *